US008233869B2

(12) United States Patent
Sarapin

(10) Patent No.: US 8,233,869 B2
(45) Date of Patent: Jul. 31, 2012

(54) AUTOMATIC GAIN CONTROL WITH IMPROVED CROSS-MODULATION

(75) Inventor: Alexander Sarapin, Westfield, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 415 days.

(21) Appl. No.: 12/312,631

(22) PCT Filed: Dec. 11, 2006

(86) PCT No.: PCT/US2006/046937
§ 371 (c)(1),
(2), (4) Date: May 19, 2009

(87) PCT Pub. No.: WO2008/073075
PCT Pub. Date: Jun. 19, 2008

(65) Prior Publication Data
US 2010/0060797 A1    Mar. 11, 2010

(51) Int. Cl.
*H04B 1/06* (2006.01)
(52) U.S. Cl. .............. 455/232.1; 455/234.1; 455/245.2
(58) Field of Classification Search ............ 455/232.1, 455/234.1, 239.1, 241.1, 245.1, 245.2, 250.1, 455/251.1; 375/344, 345
See application file for complete search history.

(56) References Cited

U.S. PATENT DOCUMENTS

| 3,579,112 A | 5/1971 | Harford |
| 3,598,902 A | 8/1971 | Davis et al. |
| 3,609,234 A | 9/1971 | Hirata |
| 4,379,269 A | 4/1983 | Ijichi |
| 4,509,207 A | 4/1985 | Tong et al. |
| 6,181,201 B1 | 1/2001 | Black |
| 6,728,524 B2 * | 4/2004 | Yamanaka et al. ......... 455/232.1 |

(Continued)

FOREIGN PATENT DOCUMENTS
BE    746805    8/1970
(Continued)

OTHER PUBLICATIONS

Ryynanen et al., "RF Gain Control in Direct Conversion Receivers," 2002 IEE Int'l. Symposium on Circuits and Systems, Phoenix-Scottsdale, AZ, USA, May 26-29, 2002, published: Piscataway, NJ, USA.

(Continued)

*Primary Examiner* — An Luu
(74) *Attorney, Agent, or Firm* — Robert D. Shedd; Joseph J. Opalach; Kuniyuki Akiyama

(57) ABSTRACT

An apparatus such as a television signal receiver provides an AGC function which reduces cross-modulation distortion. According to an exemplary embodiment, the apparatus includes first and second amplifiers coupled in series and a gain control circuit. The gain control circuit controls the gains of the first and second amplifiers in response to the magnitude of the input signal. The gain of the first amplifier remains substantially unchaged at a first level while the magnitude of the input signal is within a first range. The gain of the second amplifier is gradually reduced in the first range. The gain of the first amplifier remains substantially unchaged at a second level, which is lower than the first level, while the magnitude of the input signal is within a second range. The gain of the second amplifier gradually reduced in the second range. The gain of first amplifier is gradually reduced at least in part of a third range while the magnitude of the input signal is within the third range. The gain of the second amplifer remains substantially unchaged in the third range.

18 Claims, 5 Drawing Sheets

U.S. PATENT DOCUMENTS

| | | |
|---|---|---|
| 6,771,719 B1 | 8/2004 | Koyama et al. |
| 6,836,519 B1 | 12/2004 | Gerlach et al. |
| 7,003,271 B2 * | 2/2006 | Kluge et al. ............... 455/240.1 |
| 7,206,360 B2 * | 4/2007 | Ichihara ........................ 375/317 |
| 7,565,124 B2 * | 7/2009 | Lee et al. .................... 455/234.1 |
| 7,869,549 B2 | 1/2011 | Yang et al. |
| 2005/0146643 A1 | 7/2005 | Lee |
| 2006/0135104 A1 | 6/2006 | Lee et al. |

FOREIGN PATENT DOCUMENTS

| | | |
|---|---|---|
| CN | 1734933 | 2/2006 |
| EP | 0428170 | 5/1991 |
| EP | 1089429 | 4/2001 |
| EP | 1672786 | 6/2006 |
| JP | 1990-302129 | 12/1990 |
| JP | 2302129 | 12/1990 |
| JP | 6098277 | 12/1993 |
| JP | 1994-98277 | 4/1994 |
| JP | 1998-84500 | 3/1998 |
| JP | 10084500 | 3/1998 |
| JP | 2000/312235 | 11/2000 |
| JP | 2005/033247 | 2/2005 |
| JP | 2005/33247 | 2/2005 |
| JP | 2005-33257 | 2/2005 |
| JP | 2005033257 | 2/2005 |
| JP | 2006-109335 | 4/2006 |
| JP | 2006109335 | 4/2006 |
| JP | 2006/180054 | 7/2006 |
| WO | WO0106777 | 1/2001 |

OTHER PUBLICATIONS

International Search Report, dated Jul. 31, 2007.

PCT Search Report mailed Jul. 31. 2007.

* cited by examiner

AUTOMATIC GAIN CONTROL WITH IMPROVED CROSS-MODULATION

This application claims the benefit, under 35 U.S.C. §365 of International Application PCT/US2006/046937, filed Dec. 11, 2006 which was published in accordance with PCT Article 21(2) on Jun. 19, 2008 in English.

The present invention generally relates to automatic gain control (AGC) for apparatuses such as television signal receivers, and more particularly, to an apparatus and method for providing an AGC function which reduces cross-modulation distortion.

Various apparatuses such as television signal receivers include an AGC function to maintain adequate performance over a range of input signal levels. Certain apparatuses employ an AGC function for both radio frequency (RF) and intermediate frequency (IF) signals. Splitting the AGC function into RF and IF sections in this manner can be useful for providing desired performance in terms of noise figure and interference immunity.

With conventional apparatuses having an AGC function split into RF and IF sections, IF AGC generally starts operating first to control IF gain until an established input signal strength is attained. After this established input signal strength is attained, RF AGC begins operating and the input signal strength is controlled by both RF AGC and IF AGC signals. FIG. 3 is an exemplary graph 300 showing the relationship between RF input power and the voltages of RF AGC and IF AGC signals according to such a conventional AGC control scheme.

While the conventional AGC control scheme represented in FIG. 3 may be effective for certain applications, it is not necessarily suitable for tuner applications using circuit components such as dual gate metal oxide semiconductor field effect transistors (MOSFETs). In particular, the use of this type of conventional AGC control scheme in tuner applications using a dual gate MOSFET tends to generate an undesired amount of cross-modulation distortion. Accordingly, there is a need for an apparatus and method for providing an AGC function which addresses this issue and is thereby capable of reducing cross-modulation distortion in tuner applications using circuit components such as a dual gate MOSFET. The present invention addresses these and/or other issues.

In accordance with an aspect of the present invention, a method is disclosed. According to an exemplary embodiment, the method comprises steps of receiving an input signal, providing a first control signal at a first level to a first gain controlled amplifier while a magnitude of the input signal is within a first range, and providing the first control signal at a second level to the first gain controlled amplifier while the magnitude of the input signal is within a second range.

In accordance with another aspect of the present invention, an apparatus is disclosed. According to an exemplary embodiment, the apparatus comprises first means for receiving an input signal, and second means such as a gain control circuit for providing a first control signal at a first level to a first gain controlled amplifier while a magnitude of the input signal is within a first range and providing the first control signal at a second level to the first gain controlled amplifier while the magnitude of the input signal is within a second range.

The above-mentioned and other features and advantages of this invention, and the manner of attaining them, will become more apparent and the invention will be better understood by reference to the following description of embodiments of the invention taken in conjunction with the accompanying drawings, wherein.

Figure 4:
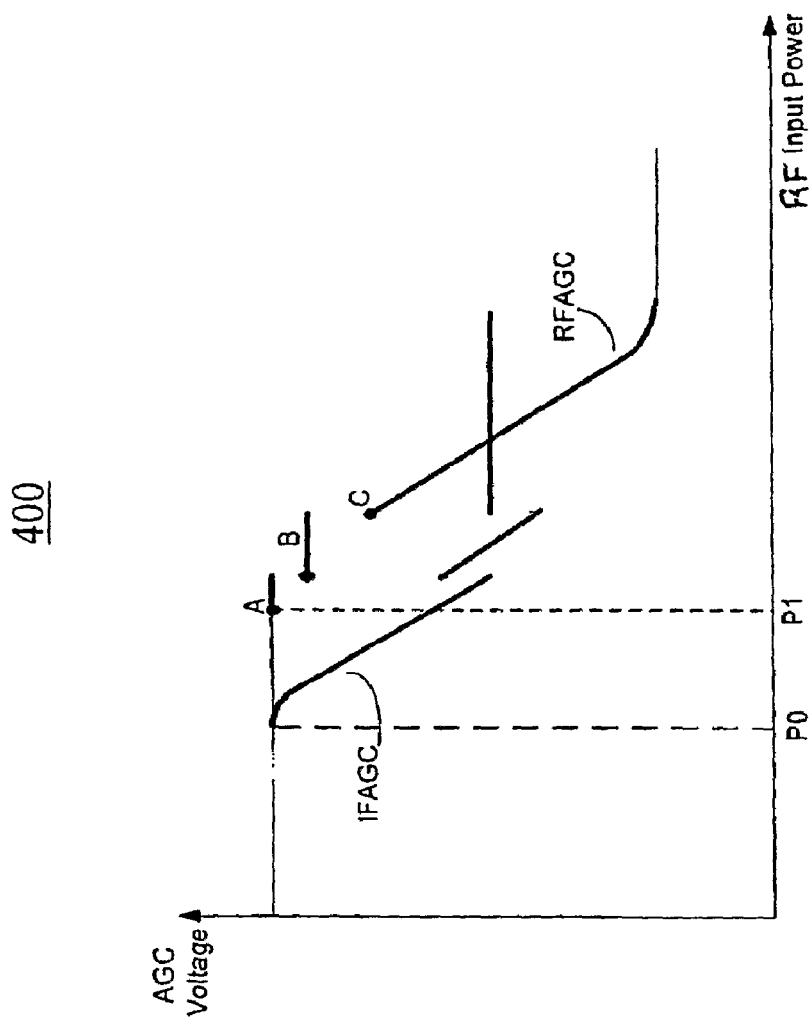
Figure 5:
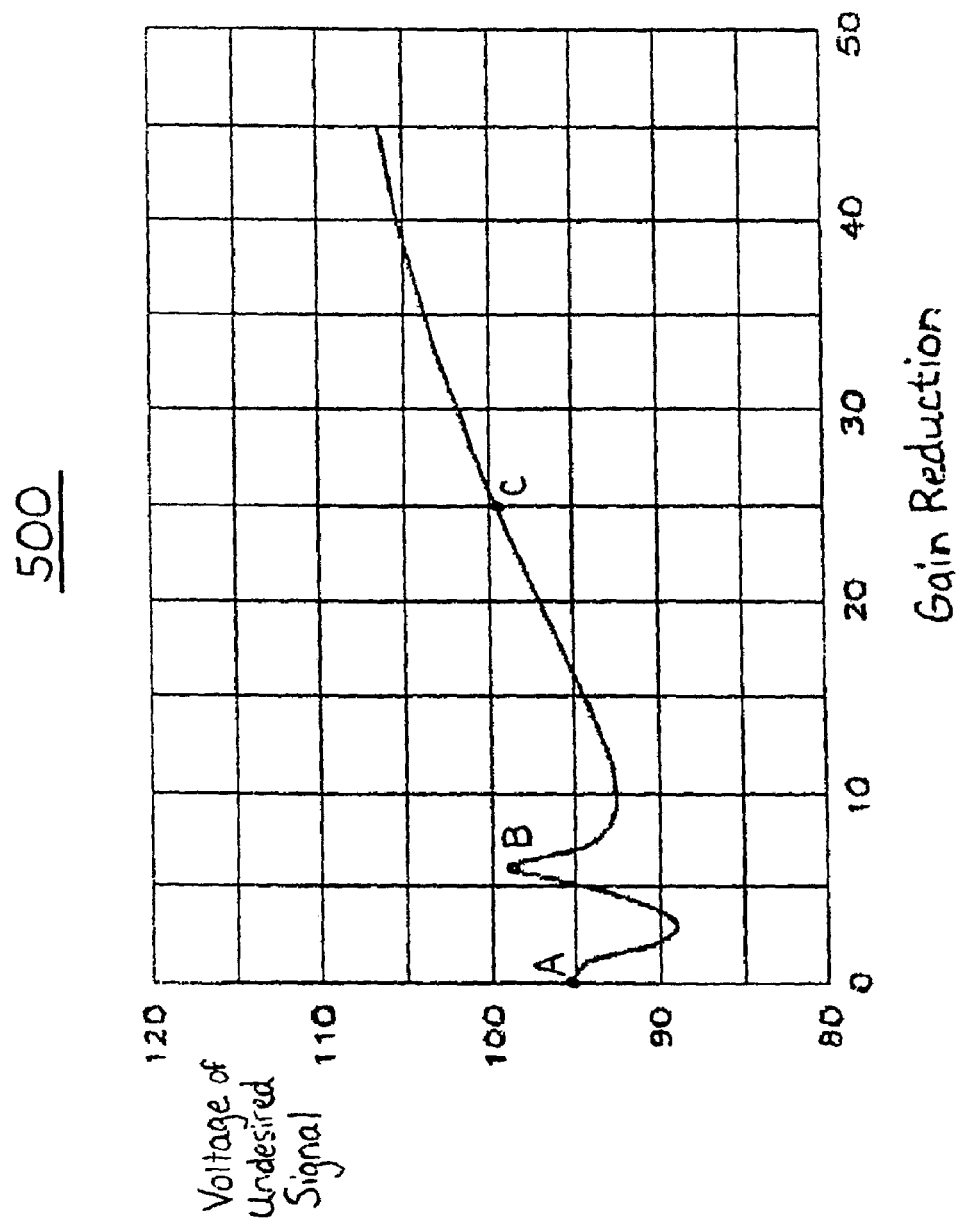

FIG. 4 is a graph showing the relationship between RF input power and the voltages of RF AGC and IF AGC signals according to an exemplary embodiment of the present invention; and FIG. 5 is a graph showing the relationship between gain reduction of a dual gate MOSFET and the voltage of an undesired cross-modulation signal according to a conventional AGC control scheme, and further showing how AGC control points may be selected according to an exemplary embodiment of the present invention.

The exemplifications set out herein illustrate preferred embodiments of the invention, and such exemplifications are not to be construed as limiting the scope of the invention in any manner.

Figure 1:
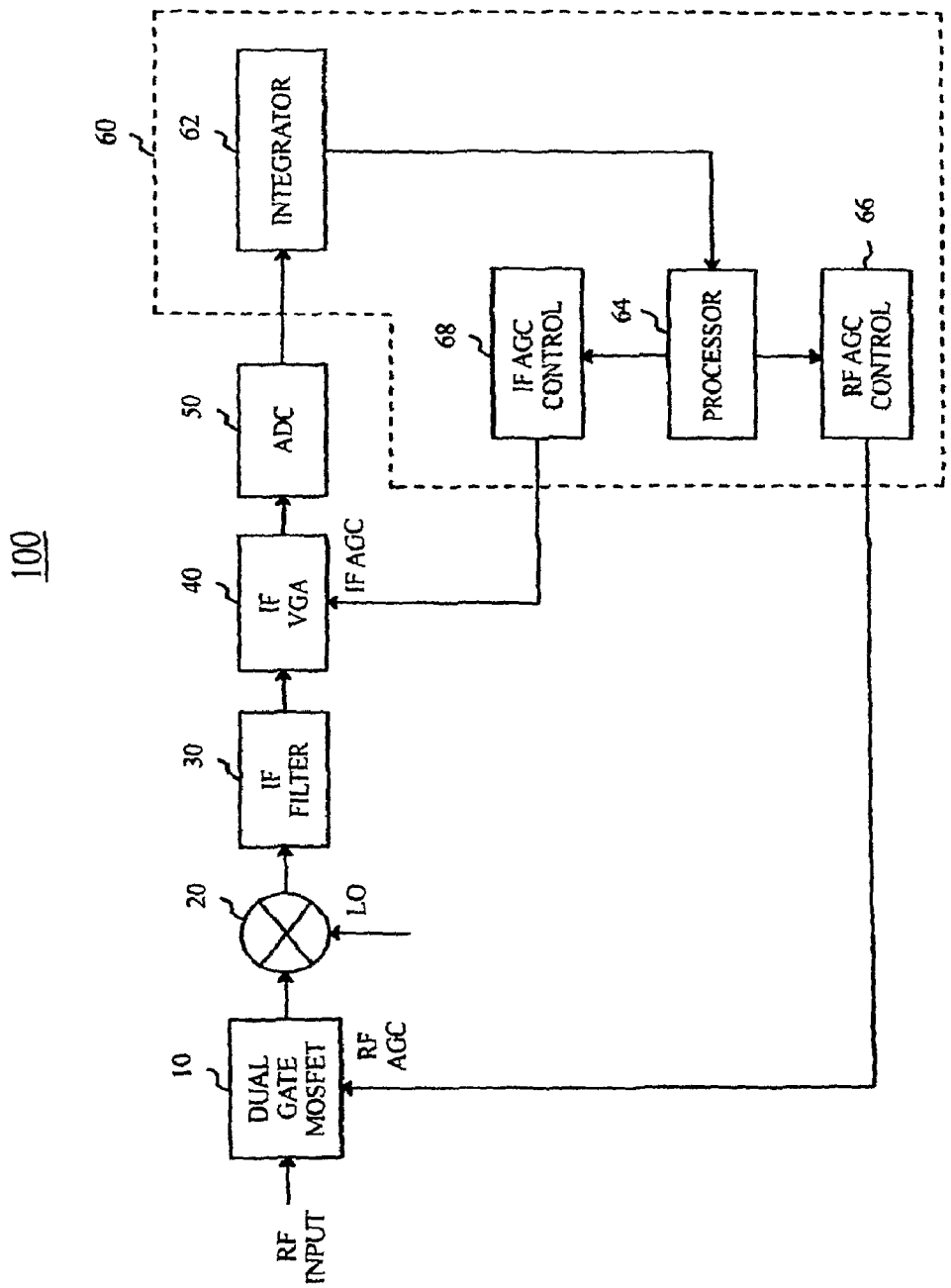
FIG. 1 is a block diagram of an apparatus for performing AGC functions is according to an exemplary embodiment of the present invention.

Referring now to the drawings, and more particularly to FIG. 1, a block diagram of an apparatus 100 for performing AGC functions according to an exemplary embodiment of the present invention is shown. Apparatus 100 may for example represent the front-end processing circuitry of an apparatus such as television signal receiver and/or other device. As shown in FIG. 1, signal processing apparatus 100 comprises a dual gate MOSFET block 10, a mixer 20, an intermediate frequency (IF) filter 30, an IF variable gain amplifier (VGA) 40, an analog-to-digital converter (ADC) 50 and an AGC circuit 60. AGC circuit 60 comprises an integrator 62, a processor 64, an RF AGC control block 66 and an IF AGC control block 68. The elements of FIG. 1 may be embodied using one or more integrated circuits (ICs). For clarity of description, certain elements associated with apparatus 100 such as certain control signals (e.g., channel selection signals), power signals and/or other elements may not be shown in FIG. 1.

Dual gate MOSFET block 10 is operative to receive an RF input signal from a signal source such as a terrestrial, cable, satellite, internet and/or other signal source, and to amplify the RF input signal in response to an RF AGC signal provided from AGC circuit 60 to thereby generate a gain controlled RF signal. According to an exemplary embodiment, the RF input signal may include audio, video and/or data content, and may be of an analog modulation scheme (e.g., NTSC, PAL, SECAM, etc.) or a digital modulation scheme (e.g., ATSC, QAM, etc.). Further exemplary details of dual gate MOSFET block 10 will now be described with reference to FIG. 2.

Figure 2:
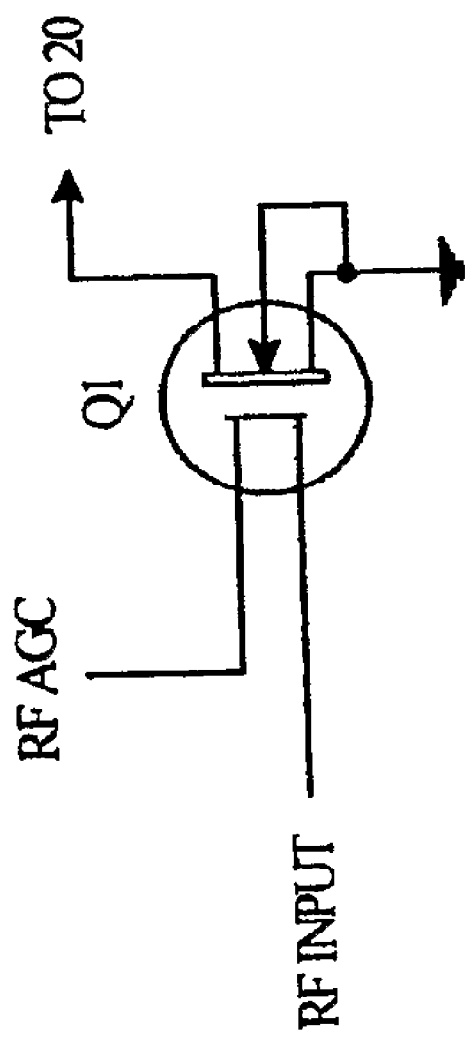
FIG. 2 is a circuit diagram showing additional details of the dual gate MOSFET block of FIG. 1 according to an exemplary embodiment of the present invention.

As indicated in FIG. 2, dual gate MOSFET block 10 comprises an n-channel MOSFET Q1. In FIG. 2, one of the gate terminals of MOSFET Q1 is coupled to receive the RF input signal. The other gate terminal of MOSFET Q1 is coupled to receive the RF AGC signal from RF AGC control block 66. The source terminal of MOSFET Q1 is coupled to ground and the body of the transistor. In operation, MOSFET Q1 amplifies the RF input signal in response to the voltage level of the RF AGC signal and outputs an amplified version of the RF input signal from its drain terminal which is provided to mixer 20. Although not expressly shown in FIG. 2, dual gate MOSFET block 10 may also include tracking filters at its gate terminal that receives the RF input signal, and at its drain terminal. Such tracking filters may be used to filter out energy from undesired frequencies.

Referring back to FIG. 1, mixer 20 is operative to mix the gain controlled RF signal provided from dual gate MOSFET block 10 with a local oscillation (LO) signal to thereby generate an IF signal. According to an exemplary embodiment, mixer 20 mixes the gain controlled RF signal with the LO signal to thereby frequency downconvert the gain controlled RF signal from an RF frequency band to an IF frequency band. In FIG. 1, dual gate MOSFET block 10 and mixer 20 collectively represent the tuner of apparatus 100.

IF filter 30 is operative to filter the IF signal provided from mixer 20 to thereby generate a filtered IF signal. According to an exemplary embodiment, IF filter 30 may include one or more individual filters (e.g., SAW filters, etc.) which remove undesired, adjacent channel energy from the IF signal provided from mixer 20 to thereby generate the filtered IF signal.

IF VGA 40 is operative to amplify the filtered IF signal provided from IF filter 30 in response to an IF AGC signal provided from AGC circuit 60 to thereby generate a gain controlled IF signal. ADC 50 is operative to convert the gain controlled IF signal provided from IF VGA 40 from an analog format to a digital format. The digital version of the gain controlled IF signal is provided to integrator 62 of AGC circuit 60, and although not expressly shown in FIG. 1, is also provided for further processing (e.g., demodulation, etc.) and output.

AGC circuit 60 is operative to control RF AGC and IF AGC functions of apparatus 100 by generating the aforementioned RF and IF AGC signals. According to an exemplary embodiment, integrator 62 of AGC circuit 60 receives the digitized version of the gain controlled IF signal provided from ADC 50 and detects its magnitude by calculating its root mean squared (RMS) power value. Integrator 62 provides an output signal to processor 64 which indicates the magnitude (i.e., RMS power value) of the gain controlled IF signal.

Figure 3:
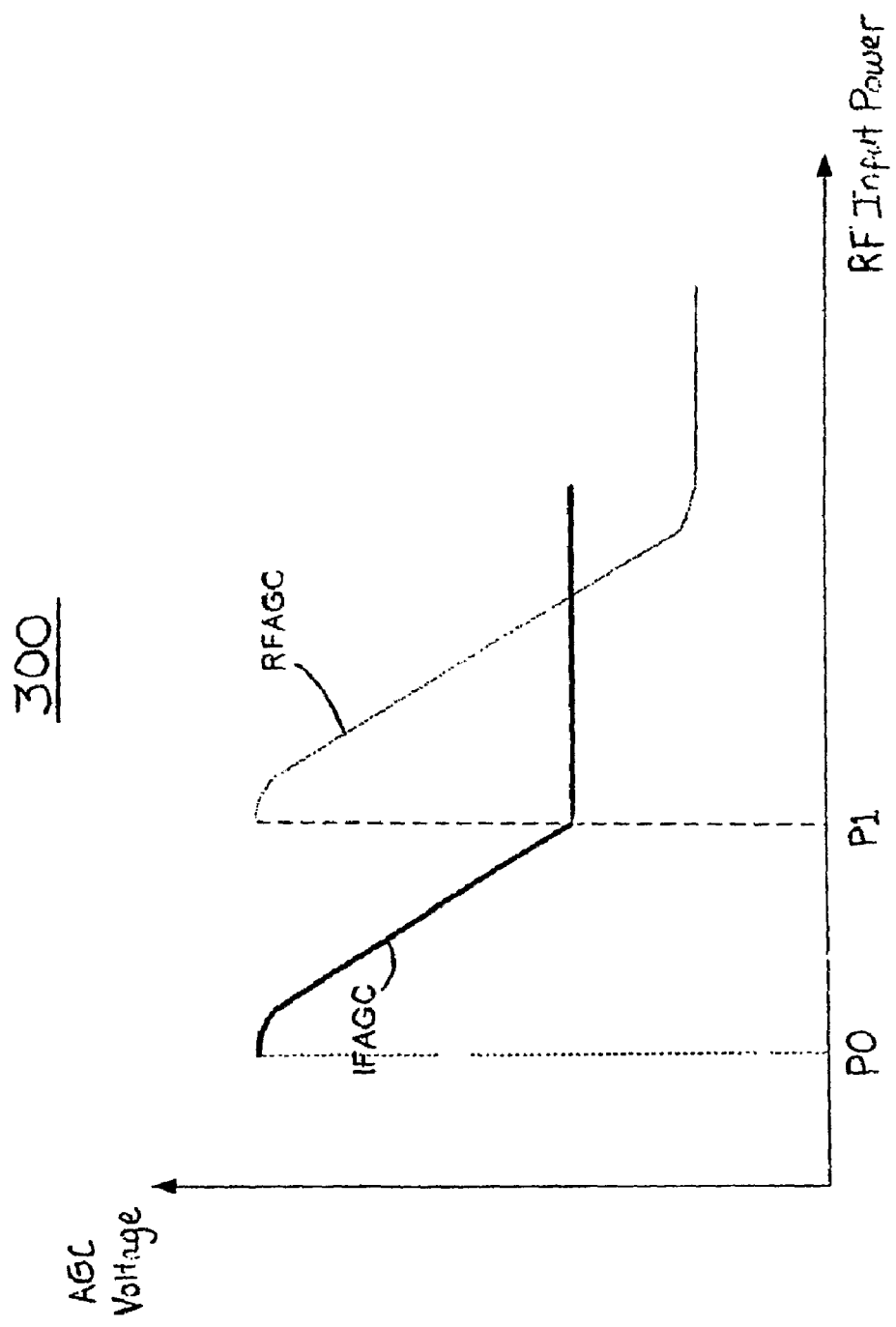
FIG. 3 is a graph showing the relationship between RF input power and the voltages of RF AGC and IF AGC signals according to a conventional AGC control scheme.

Processor 64 is operative to control the RF AGC and IF AGC functions of apparatus 100 in response to the output signal from integrator 62 which indicates the magnitude (i.e., RMS power value) of the gain controlled IF signal. According to an exemplary embodiment, processor 64 is programmed to calculate an estimation of the RF input power using the output signal from integrator 62 and provides control signals to RF AGC control block 66 and IF AGC control block 68 which control the voltage levels of the RF AGC and IF AGC signals, respectively, based on the RF input power. Processor 64 may calculate an estimation of the RF input power in various different known ways, and the specific manner in which the RF input power is estimated is not an essential element of the present invention. According to principles of the present invention, the control signals provided from processor 64 cause RF AGC control block 66 and IF AGC control block 68 to respectively generate the RF AGC and IF AGC signals in the manner represented in graph 400 of FIG. 4, which can be contrasted with the conventional AGC control scheme represented in FIG. 3.

Referring to FIG. 4, graph 400 shows the relationship between RF input power and the voltage levels of the RF AGC and IF AGC signals according to an exemplary embodiment of the present invention. In FIG. 4, RF input power is represented in dBm (or dBuV, etc.) and AGC voltage is represented in volts (normalized) where signal gain increases with AGC voltage. For purposes of example and explanation, the RF AGC and IF AGC signals are both shown on a single graph without reference to any specific voltage levels or ranges. In practice, the actual voltage levels and ranges used for the RF AGC and IF AGC signals may vary according to design choice depending on the specific application, but should be provided in accordance with the principles represented in FIG. 4.

As represented in FIG. 4, IF AGC control block 68 starts controlling the gain of IF VGA 40 via the IF AGC signal when the RF input power is at an initial value of P0. The voltage of the IF AGC signal then gradually decreases as the RF input power increases. When the RF input power is below the initial value of P0, IF AGC control block 68 provides the IF AGC signal to IF VGA 40 at a level corresponding to maximum gain.

When the RF input power is below point B, RF AGC control block 66 provides the RF AGC signal to dual gate MOSFET block 10 at a level corresponding to maximum gain. When the RF input power reaches point B, RF AGC control block 66 starts reducing the gain of dual gate MOSFET block 10 via the RF AGC signal. As represented in FIG. 4, RF AGC control block 66 provides the RF AGC signal to dual gate MOSFET block 10 at a first (substantially constant) voltage level which corresponds to maximum gain while the RF input power is within a first range from point A to point B. This is contrasted with the conventional AGC control scheme of FIG. 3 which begins reducing RF gain when the RF input power reaches a value of P1 (i.e., point A in FIG. 4). The voltage of the IF AGC signal continues to gradually decrease while the RF input power is within the first range from point A to point B.

Once the RF input power reaches point B, RF AGC control block 66 provides the RF AGC signal to dual gate MOSFET block 10 at a second (substantially constant) voltage level while the RF input power is within a second range from point B to point C (which is higher than the first range from point A to point B). As represented in FIG. 4, this second voltage level of the RF AGC signal which is provided while the RF input power is within the second range from point B to point C is lower than the first voltage level of the RF AGC signal which is provided while the RF input power is below point B. Also when the RF input power reaches point B, IF AGC control block 68 increases the voltage level of the IF AGC signal provided to IF VGA 40 in the manner represented in FIG. 4.

Once the RF input power reaches point C, RF AGC control block 66 provides the RF AGC signal to dual gate MOSFET block 10 at a variable voltage level which decreases as the RF input power increases and eventually levels off to a substantially constant voltage level, as represented in FIG. 4. Also when the RF input power reaches point C, IF AGC control block 68 increases the voltage level of the IF AGC signal and provides the IF AGC signal to IF VGA 40 at this increased voltage level in a substantially constant manner, as represented in FIG. 4.

Referring to FIG. 5, a graph 500 showing the relationship between gain reduction of dual gate MOSFET 10 and the voltage of an undesired cross-modulation signal according to a conventional AGC control scheme, and further showing how the aforementioned AGC control points A-C may be selected according to an exemplary embodiment of the present invention is provided. As represented in FIG. 5, the relationship between gain reduction and the voltage of an undesired cross-modulation signal according to a conventional AGC control scheme is non-linear and includes an S-shaped portion. Ideally, this curve should be more linear to reduce undesired cross-modulation distortion.

Also represented in FIG. 5, AGC control points A-C of FIG. 4 may be selected by processor 64 based on the gain reduction (e.g., in dB) of a received RF input signal (i.e., the RF input signal received by dual gate MOSFET 10). FIG. 5 shows these points A-C in relation to the voltage (e.g., in dBμV) of an undesired 1% cross-modulation signal. According to FIG. 5, point A may correspond to a point where the gain reduction of a received RF input signal is equal to 0 dB, point B may correspond to a point where the gain reduction of a received RF input signal is equal to approximately 7 dB, and point C may correspond to a point where the gain reduction of a received RF input signal is equal to approximately 25 dB.

According to an exemplary embodiment, processor 64 is programmed to know the current gain reduction of a received RF input signal based on the current state of the RF AGC signal, whose magnitude it controls via RF AGC control block 66. Since RF input power and the gain of a received RF input signal are correlated, selecting points A-C based on the gain reduction of a received RF input signal as represented in FIG. 5 is another way in which processor 64 can control the RF AGC and IF AGC signals in the manner represented in FIG. 4 (as opposed to directly calculating an to estimation of the RF input power). The values represented in FIG. 5 are exemplary only, and points A-C may be set to correspond to other points than expressly shown therein.

As described herein, the present invention provides an apparatus and method for providing an AGC function which reduces cross-modulation distortion. The present invention may be applicable to various apparatuses, either with or without an integrated display device. While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A method, comprising the steps of:
providing an input signal for a first amplifier; and
generating first and second control signals, said first control signal controlling a gain of said first amplifier in response to a magnitude of said input signal and said second control signal controlling a gain of a second amplifier coupled to said first amplifier in series in response to said magnitude of said input signal, wherein:
said first control signal remains substantially unchanged at a first level while said magnitude of said input signal is within a first range,
said first control signal remains substantially unchanged at a second level while said magnitude of said input signal is within a second range in which said magnitude of said input signal exceeds said magnitude of said input signal in said first range, said gain of said first amplifier in said second range is substantially lower than said gain of said first amplifier in said first range,
said first control signal changes with a first variable level in a third range in which said magnitude of said input signal exceeds said magnitude of said input signal in said second range, said gain of said first amplifier in at least a part of said third range is gradually reduced, said gain of said first amplifier in said third range is substantially lower than said gain of said first amplifier in said second range,
said second control signal changes with a second variable level in said first range, said gain of said second amplifier is gradually reduced,
said second control signal changes with a third variable level in said second range, said gain of said second amplifier is gradually reduced,
said second control signal remains substantially unchanged at a third level in said third range.

2. The method of claim 1, wherein:
said second control signal changes at a beginning point of said second range and said gain of said second amplifier rises at said beginning point of said second range.

3. The method of claim 1, wherein:
said second control signal changes to said third level at a beginning point of said third range and said gain of said second amplifier rises at said begging point of said third range.

4. The method of claim 2, wherein:
said second control signal changes to said third level at a beginning point of said third range and said gain of said second amplifier rises at said beginning point of said third range.

5. The method of claim 1, wherein said first gain controlled amplifier includes a dual gate MOSFET.

6. The method of claim 1, wherein:
said first control signal includes an RF AGC signal; and
said second control signal includes an IF AGC signal.

7. An apparatus, comprising:
an input point receiving an input signal;
first amplifier coupled to said input point, said first amplifier amplifying said input signal, a gain of said first amplifier changing in response to a first control signal;
second amplifier coupled in series to said first amplifier, said second amplifier amplifying an output of said first amplifier in a lower frequency domain, a gain of said second amplifier changing in response to a second control signal; and
a control circuit coupled to said first and second amplifiers, said control circuit generating said first and second control signals in response to a magnitude of said input signal, wherein:
said first control signal remains substantially unchanged at a first level while said magnitude of said input signal is within a first range,
said first control signal remains substantially unchanged at a second level while said magnitude of said input signal is within a second range in which said magnitude of said input signal exceeds said magnitude of said input signal in said first range, said gain of said first amplifier in said second range is lower than said gain of said first amplifier in said first range,
said first control signal changes with a first variable level in a third range in which said magnitude of said input signal exceeds said magnitude of said input signal in said second range, said gain of said first amplifier in at least a part of said third range is gradually reduced and said gain of said first amplifier in said third range is lower than said gain of said first amplifier in said second range,
said second control signal changes with a second variable level in said first range, said gain of said second amplifier is gradually reduced,
said second control signal changes with a third variable level in said second range, said gain of said second amplifier is gradually reduced,
said second control signal remains substantially unchanged at a third level in said third range.

8. The apparatus of claim 7 wherein:
said second control signal changes at a beginning point of said second range and said gain of said second amplifier rises at said beginning point of said second range.

9. The apparatus of claim 7 wherein:
said second control signal changes to said third level at a beginning point of said third range and said gain of said second amplifier rises at said begging point of said third range.

10. The apparatus of claim 8 wherein:
said second control signal changes to said third level at a beginning point of said third range and said gain of said second amplifier rises at said begging point of said third range.

11. The apparatus of claim 7 wherein:
said first amplifier includes a dual gate MOSFET.

12. The apparatus of claim 7 wherein:
said input signal includes an RF band of frequencies and said lower frequency domain includes an IF band of frequencies.

13. An apparatus, comprising:
means for receiving an input signal;
first amplifying means for amplifying said input signal, a gain of said first amplifying means changing in response to a first control signal;
second amplifying means for amplifying an output of said first amplifying means in a lower frequency domain, a gain of said second amplifying means changing in response to a second control signal; and
means for generating said first and second control signals in response to a magnitude of said input signal, wherein:
said first control signal remains substantially unchanged at a first level while said magnitude of said input signal is within a first range,
said first control signal remains substantially unchanged at a second level while said magnitude of said input signal is within a second range in which said magnitude of said input signal exceeds said magnitude of said input signal in said first range and said gain of said first amplifying means in said second range is lower than said gain of said first gain-controlled amplifying means in said first range,
said first control signal changes with a first variable level in a third range in which said magnitude of said input signal exceeds said magnitude of said input signal in said second range, said gain of said first amplifying means in at least a part of said third range is gradually reduced and said gain of said first amplifying means in said third range is lower than said gain of said first amplifying means in said second range,
said second control signal changes with a second variable level in said first range and said gain of said second amplifying means is gradually reduced,
said second control signal changes with a third variable level in said second range and said gain of said second amplifying means is gradually reduced,
said second control signal remains substantially unchanged at a third level in said third range.

14. The apparatus of claim 13 wherein:
said second control signal changes at a beginning point of said second range and said gain of said second amplifying means rises at said beginning point of said second range.

15. The apparatus of claim 13 wherein:
said second control signal changes to said third level at a beginning point of said third range and said gain of said second amplifying means rises at said begging point of said third range.

16. The apparatus of claim 14 wherein:
said second control signal changes to said third level at a beginning point of said third range and said gain of said second amplifying means rises at said begging point of said third range.

17. The apparatus of claim 13 wherein:
said first amplifying means includes a dual gate MOSFET.

18. The apparatus of claim 13 wherein:
said input signal includes an RF band of frequencies and said lower frequency domain includes an IF band of frequencies.

* * * * *